United States Patent [19]
Ohashi

[11] Patent Number: 5,084,887
[45] Date of Patent: Jan. 28, 1992

[54] DRIVING DEVICE FOR SEMICONDUCTOR LASER

[75] Inventor: Tsuyoshi Ohashi, Hashima, Japan

[73] Assignee: Brother Kogyo Kabushiki Kaisha, Japan

[21] Appl. No.: 664,847

[22] Filed: Mar. 5, 1991

[30] Foreign Application Priority Data

Mar. 7, 1990 [JP] Japan ................................ 2-55961

[51] Int. Cl.⁵ .............................................. H01S 3/00
[52] U.S. Cl. ........................................ 372/38; 372/26; 372/29
[58] Field of Search ................ 372/26, 25, 29, 31, 372/38

[56] References Cited

U.S. PATENT DOCUMENTS 4,689,795  8/1987  Yoshimoto et al. ............... 372/31
4,768,198  8/1988  Deki ................................ 372/25

Primary Examiner—Leon Scott, Jr.
Attorney, Agent, or Firm—Oliff & Berridge

[57] ABSTRACT

A driving device for stimulating light emission of a semiconductor laser, comprises a driving circuit for applying the semiconductor laser to a pumping signal including a biasing current and a modulated signal to emit laser light from the laser source, a photosensor for detecting the laser light and outputting a detection signal representing light amount of the detected laser light, a compensating unit comprising a comparator and an integrating circuit for generating a binary-coded biasing signal for producing the biasing current while compensating fluctuation of the threshold current of the semiconductor laser on the basis of the detected signal from the photosensor every predetermined period, an adding circuit for adding the biasing signal of the compensating unit to the input modulated signal and outputting the added signals therefrom, and a constant-current circuit for generating a predetermined constant current. The constant current of the constant-current generating unit and the added signals of the adding unit are added to each other and supplied to the semiconductor laser as the pumping signal.

6 Claims, 5 Drawing Sheets

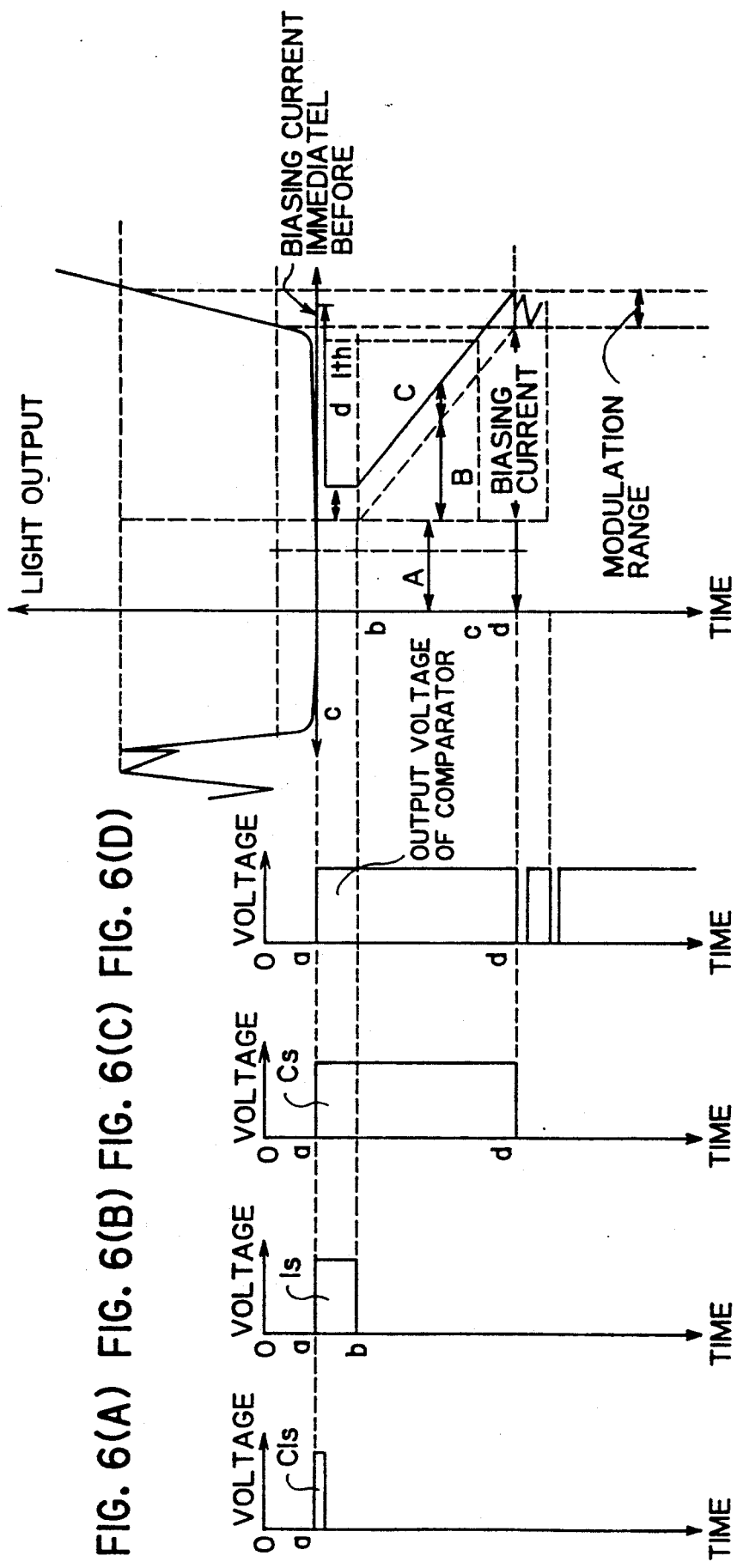

DRIVING DEVICE FOR SEMICONDUCTOR LASER

BACKGROUND OF THE INVENTION

This invention relates to a driving device for driving a semiconductor laser to emit laser light, and more particularly to a driving device capable of modulating light intensity to be outputted from a semiconductor laser.

A semiconductor laser has been conventionally utilized in an image forming apparatus such as a laser printer or the like. In order to increase an image forming speed in such an image forming apparatus, it is really preferable to set the maximum light intensity to be used for an exposing process approximately to the maximum permissible light intensity of the semiconductor laser. However, an output characteristic of the semiconductor laser is unavoidably changed by an external factor such as temperature or the like, and thus it is difficult to perform the above real setting operation in light intensity.

In view of the above disadvantage of the semiconductor laser, the same applicant as this application has proposed a driving device for dynamically changing a biasing current for stimulating light emission of the semiconductor laser in U.S. Pat. No. 4,916,706 published on Apr. 10, 1990, and this device is shown in FIG. 1.

In this type of driving device, the semiconductor laser 1 is pumped by a pumping or biasing current corresponding to the maximum value of modulated image data on the basis of a light-intensity correction signal which occurs every constant period. The intensity of laser light outputted from the semiconductor laser 1 is compared with the permissible light-intensity of the semiconductor laser 1 in a judging circuit 2 to output a result to a threshold data generator 3. The threshold data generator 3 generates, for example, an 8-bit threshold data on the basis of the inputted result thereto, and then outputs the threshold data to a adding circuit 4. In the adding circuit 4, the 8-bit threshold data and 8-bit modulated data are added to each other, and then inputted to a driving circuit 5 for driving the semiconductor laser 1. The driving circuit 5 generates a biasing current corresponding to the added 8-bit data to control light-emission of the semiconductor laser with the biasing current.

However, since many semiconductor lasers which have been commercially sold, have in a market have individually different characteristics such as a threshold current and so on, it frequently occurs that some semiconductor lasers are inoperable for the above driving device. Therefore, it has been hitherto required to select semiconductor lasers in consideration of not only the least upper limit biasing current, but also the change of a threshold current in accordance with the change of temperature, that is, the change of the lowest limit of an operating area which corresponds to the lowest biasing current for maintaining the linearity between an output power of the laser light and a supplied current to the semiconductor laser. This selection is very intricate and thus disturbs a manufacturing cost of the semiconductor laser to be lowered.

In order to overcome the above disadvantage, it is possible to expand a changeable range of the threshold data to be generated in the threshold data generator 3 in accordance with variation of the threshold biasing current of the semiconductor laser. However, this method causes a large quantization error because the changeable range of the threshold data which is represented by one binary code is also broader, so that it is difficult to finely and accurately change the output power of the laser light of the semiconductor laser. Particularly, in a case where such a driving device is used in an image forming apparatus such as a laser printer, an output image is deteriorated in color gradation, and thus an image having intermediate color gradation (tone) can not be obtained.

SUMMARY OF THE INVENTION

An object of this invention is to provide a driving device for a semiconductor laser in which light-emission of the laser is accurately stimulated without selecting a specific semiconductor laser and without decreasing an output power of the semiconductor laser.

In order to attain the above object, a driving device according to this invention in which light emission of a laser source having a threshold current for the light emission is stimulated with a pumping signal including a biasing current and an input modulated signal, comprises a driving unit for applying the laser source to the pumping signal to emit laser light from the laser source, a photodetecting unit for detecting the laser light and outputting a detection signal representing light amount of the detected laser light, a compensating unit for generating a binary-coded biasing signal for producing the biasing current while compensating fluctuation of the threshold current of the laser source on the basis of the detected signal from the photodetecting unit every predetermined period, an adding unit for adding the biasing signal of the compensating unit to the input modulated signal and outputting the added signals therefrom, and a constant-current generating unit for generating a predetermined constant current, wherein the constant current of the constant-current generating unit and the added signals of the adding unit are added to each other and supplied to the semiconductor laser as a pumping signal.

According to the driving device of this invention, the input modulated signal is added to the biasing signal and then the added result is converted into a corresponding current. The current is added to the constant current of the constant-current generating unit, and then supplied to the laser source. Since the constant current is beforehand set to a suitable current equal to or lower than the lowerst limit of an ordinary operating area of each laser source, fluctuation in threshold current of individual laser sources is completely compensated by the above constant current. Therefore, it is sufficient for the compensating unit to have only a function of compensating fluctuation of output characterisitics due to factors other than the factors of the laser sources such as threshold current and so on. Accordingly, it is possible to narrow a changeable range of the biasing signal, and thus the modulated signal is converted into a modulated laser light with high accuracy.

BRIEF DESCRIPTION OF THE DRAWINGS

FIG. 6 shows a relationship between an output power of laser light and a biasing current in the driving device of this invention, together with a time chart.

DETAILED DESCRIPTION OF THE INVENTION

A preferred embodiment of this invention will be described hereunder with reference to the accompanying drawings.

Figure 2:
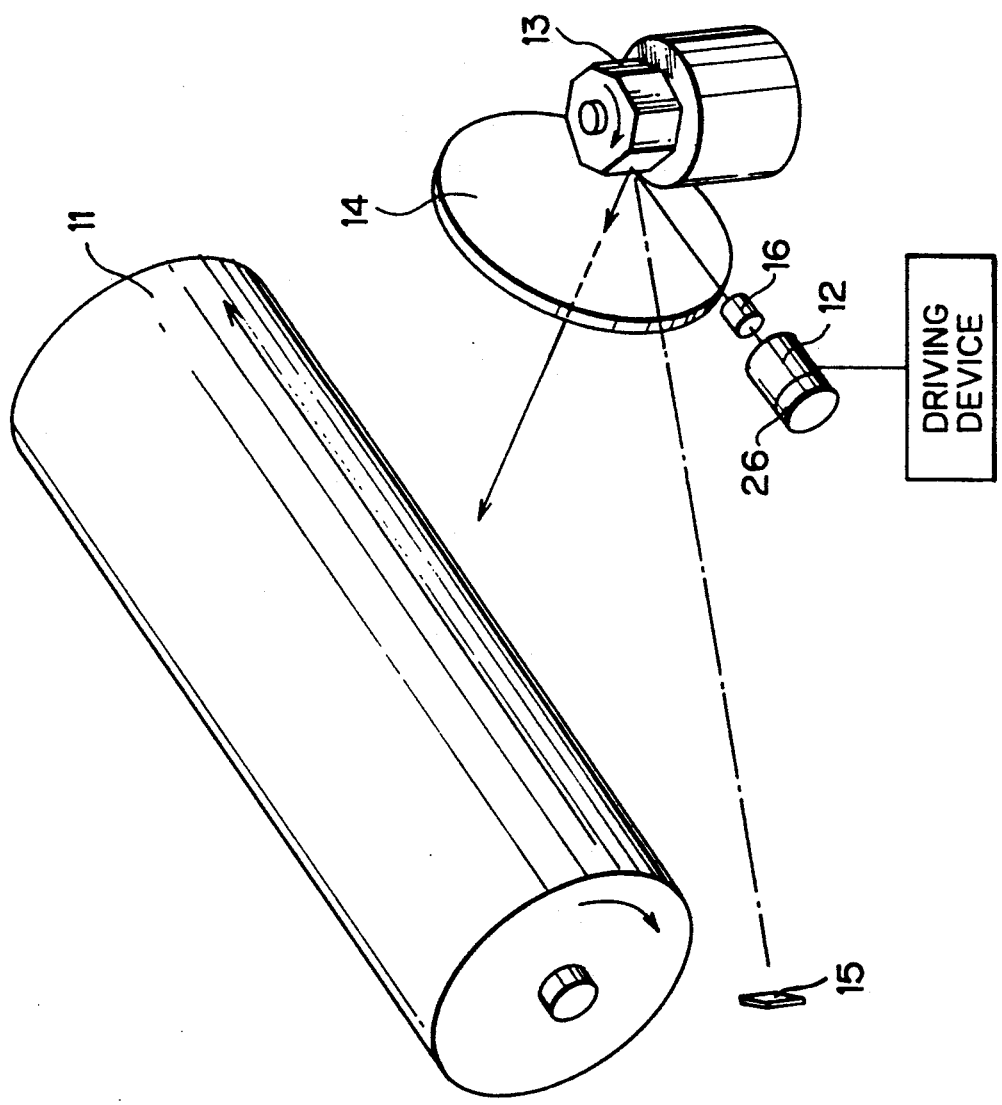
FIG. 2 shows a laser printer in which a driving device according to this invention is utilized.

FIG. 2 shows a laser printer including a semiconductor laser 12 disposed at a predetermined position for emitting a laser light, a driving device of an embodiment of this invention as described hereunder, a photosensitive drum 11 for forming an electrostatical latent image thereon by irradiating a modulated laser light from the semiconductor laser thereto, a collimating lens 16, an F θ lens 14, a photodiode 26, and a photosensor 15. The laser light is collimated through the collimating lens 16, and then reflected from a rotatable polygonal mirror 13 through the F θ lens to the photosensitive drum 11. The rotation of the polygonal mirror 13 performs a main scanning operation of the laser light on the photosensitive drum 11 in which the modulated laser light from the semiconductor laser 12 is scanned horizontally at a constant speed on the photosensitive drum 11 to form the latent image thereon.

Figure 3:
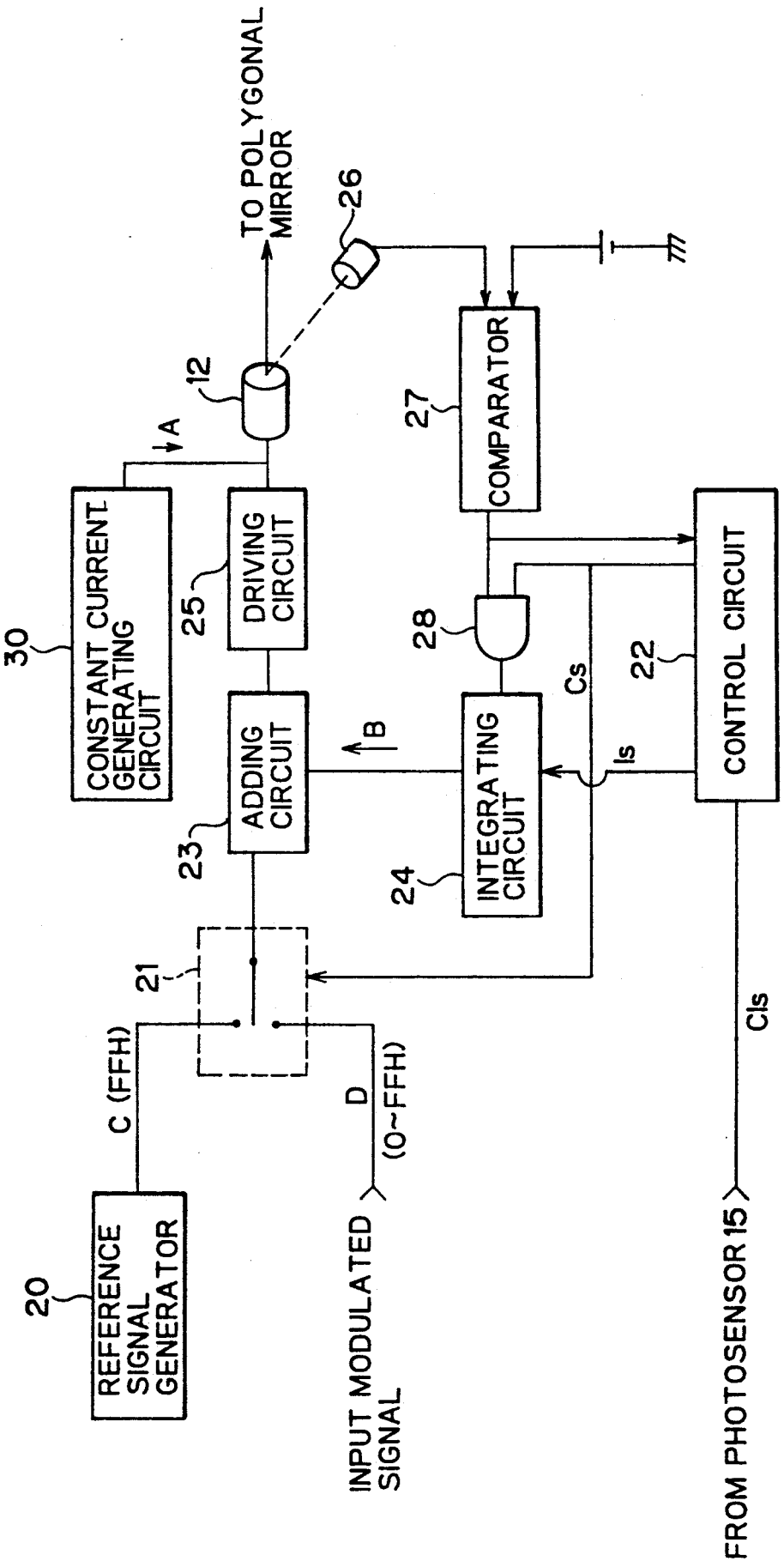
FIG. 3 is a block diagram for showing the driving device according to this invention.

FIG. 3 shows the driving device for pumping the semiconductor laser 12 to stably emit the laser light having a predetermined output power.

The laser light to be emitted from the semiconductor laser 12 is modulated in light amount by a modulation signal D. The modulation signal D is represented by 8-bit digital data from 0 to FFH, and inputted through one of two input terminals of a change-over switch 21 to the driving device as shown in FIG. 3. The other input terminal of the change-over switch 21 is supplied with a reference signal C representing FFH from a reference signal generator 20. The change-over switch 21 comprises plural field effect transistors (FETs), and is connected to a control circuit 22 as described below. One of the input terminals of the changeover switch 21 is selectively connected to an output terminal of the change-over switch 21 in accordance with a control signal Cs outputted from the control circuit 22, and the output terminal of the change-over switch 21 is connected to one of two input terminals of an adding circuit 23.

The adding circuit 23 is further supplied through the other input terminal thereof with a biasing or threshold signal (value) from a integrating circuit 24, and performs an adding operation between an output signal of the changeover switch 21 and the biasing (threshold) signal to output a digital signal representing a adding result through an output terminal thereof. The output terminal of the adding circuit 23 is connected to a driving circuit 25 for performing a D/A (digital-to-analog) conversion of the digital signal of the adding circuit 23 and supplying the semiconductor laser 12 with a biasing current corresponding to the thus converted analog signal. A conversion efficiency η of the driving circuit 25 is set to a suitable value every semiconductor laser.

Figure 5:
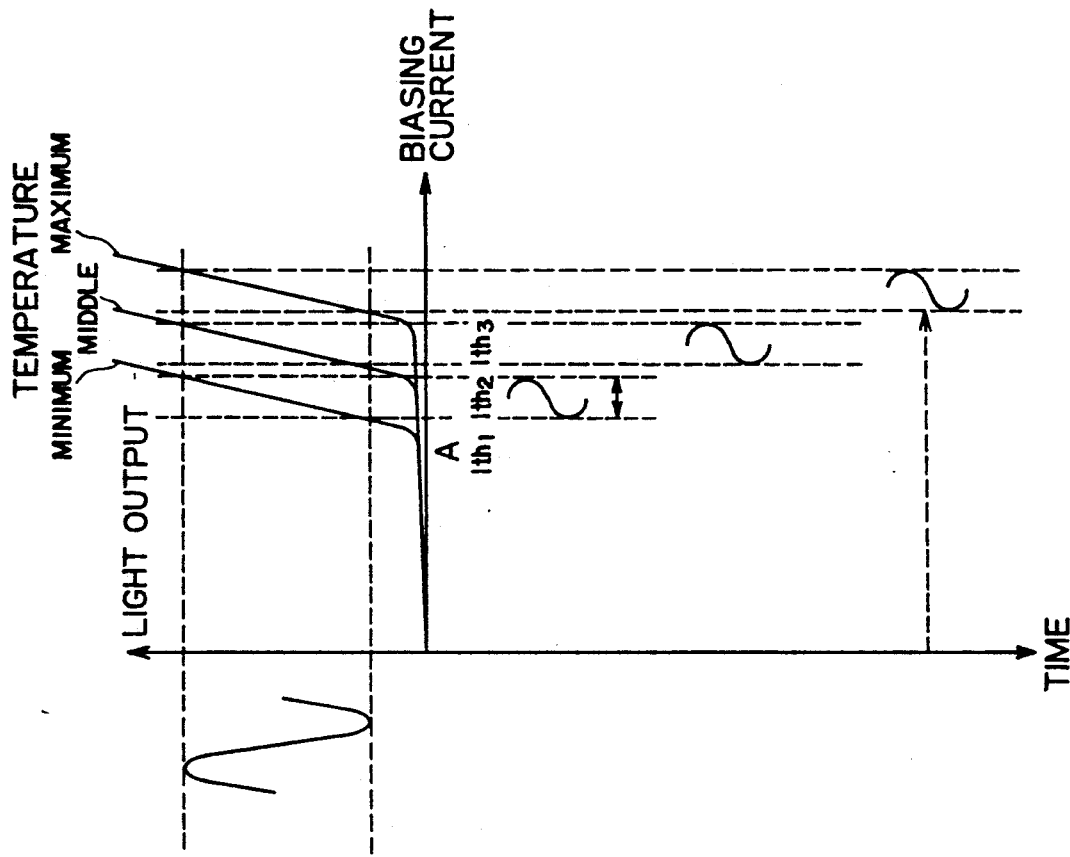
FIG. 5 shows change of the relationship as shown in FIG. 4 in accordance with change of temperature.
Figure 4:
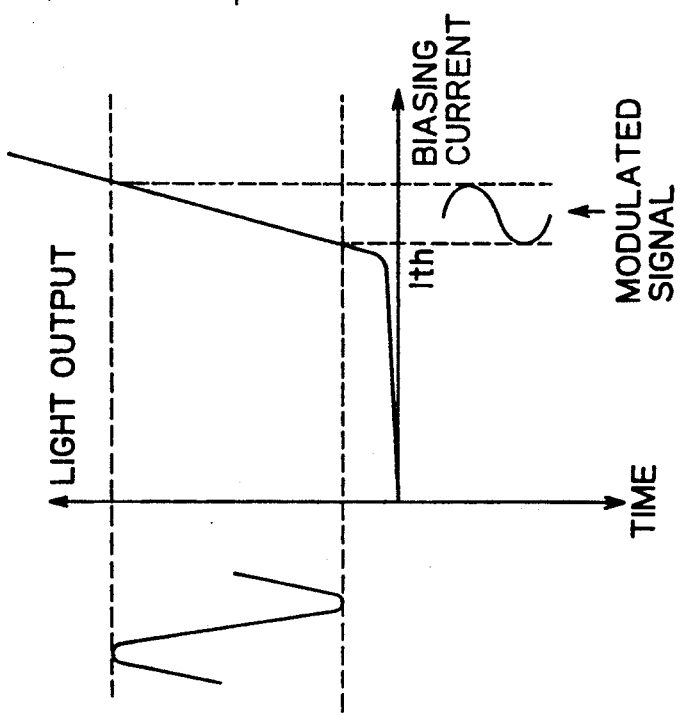
FIG. 4 shows a relationship between an output power of laser light and a biasing current to be applied to the semiconductor laser.

FIG. 4 shows a relationship between an output power (light output) and a biasing current to be supplied to the semiconductor laser, and FIG. 5 shows change of the relationship as shown in FIG. 4 in accordance with change of temperature. As shown in FIG. 5, the threshold current of the semiconductor laser is increased as the temperature is increased. As described below, the driving device according to this embodiment can enable the semiconductor laser to output an output power corresponding to the input modulation signal with high accuracy irrespective of the change of temperature, that is, the change of the threshold current Ith.

FIGS. 6(A) through 6(E) show a relationship between light output and biasing current of the semiconductor laser 12 together with a time chart. As shown in FIGS. 6(A) through 6(E), light emission does not occur until the biasing current reaches a predetermined threshold current Ith, but occurs after the biasing current exceeds the threshold current Ith. As shown in FIG. 6(E), the amount of laser light emitted from the semiconductor laser is increased in direct proportion to the biasing current after the biasing current exceeds the threshold current Ith. However, the semiconductor laser 12 is broken when the light output of the semiconductor laser 12 exceeds the maximum rating light power thereof, and thus in this embodiment, the maximum light power to be outputted from the semiconductor laser 12 is beforehand set as a maximum pumping light power to 60% of the maximum rating light power.

As shown in FIG. 3, the semiconductor laser 12 is further connected to a constant-current circuit 30 which is a circuit for supplying a constant current A irrespective of variation of load. The constant current circuit 30 is beforehand designed such that the constant current A to be supplied from the constant-current circuit 30 is slightly lower than a threshold current Ith at the minimum permissible temperature of the semiconductor laser 12 as shown in FIG. 5.

A part of the laser light emitted from the semiconductor laser 12 is detected by the photodiode 26 which is formed integrally with the semiconductor laser 12 and electrically connected to a comparator 27, and the other part of the semiconductor laser 12 is applied to the polygonal mirror 13 to form the latent image on the photosensitive drum 11. A photocurrent flowing in the photodiode 26 in response to detection of the laser light is converted into a voltage (hereinafter referred to as "detection voltage"), and inputted to one of two input terminals of the comparator 27.

The other input terminal of the comparator 27 is supplied with a reference voltage which is identical to a detection voltage when a signal of FFH is inputted as a modulation signal to the driving device to allow the semiconductor laser to emit laser light having the maximum pumping light power. The comparator 27 outputs through an output terminal thereof a predetermined positive voltage when the detection voltage is lower than the reference voltage, and outputs 0 volt at the output terminal thereof when the detection voltage is equal to or higher than the reference voltage.

The output terminal of the comparator 27 is connected to one of input terminals of an AND gate, and further connected to the integrating circuit 24 through the AND gate. The output signal of the comparator 27 is selectively supplied to the integrating circuit 24 through the AND gate 28 by applying the control signal of the control circuit 22 to the other input terminal of the AND gate 28.

The integrating circuit 24 includes a clock generator and an up-and-down counter, and integrates the output signal of the comparator 27 over a period when the output signal is passed from the comparator 27 through the AND gate 28 to the integrating circuit 24. The integrated value (biasing value) is adjusted so as to be equal to a current value obtained by subtracting the constant current A from the threshold current Ith as described hereinafter, and outputted to the input terminal of the adding circuit 23. Moreover, upon inputting an initializing signal Is from the control circuit 22 to the integrating circuit 24, the integrating circuit 24 sets an initial output value to a value which is obtained by subtracting a predetermined value d from an integrated value immediately before the initializing signal is inputted to the integrating circuit 24.

The control circuit 22 is designed so as to generate the control signal Cs and the initializing signal Is on the basis of a correction indicating signal CIs which is inputted from an external (photosensor 15). The control signal Cs is kept at a predetermined positive voltage for a period from a time when the correction indicating signal CIs is inputted to the control circuit 22 to a time when the voltage of the output terminal of the comparator 27 becomes 0 volt for the first time, and kept at 0 volt for the other period. Further, the initializing signal Is is kept at a predetermined voltage for a minute period after the correction indicating signal is inputted to the control circuit 22, and kept at 0 volt for the other period. The correction indicating signal CIs is generated at a time when the laser light of the semiconductor laser 12 is detected by the photosensor 15.

An driving operation of the driving device according to this embodiment will be described hereunder with reference to FIGS. 3 and 6.

During a main scanning operation, the control signal Cs is kept at 0 volt and the change-over switch 21 outputs the modulation signal D to the adding circuit 23. The modulation signal D is added to the biasing value of the integrating circuit 24 in the adding circuit 23. The output signal of the adding circuit 23 is inputted to the driving circuit 25, so that a biasing current corresponding to the output signal of the adding circuit 23 is generated and outputted to the semiconductor laser 12. The biasing current thus generated is added with a constant current of the constant-current circuit 30 and then is used as a pumping current for the semiconductor laser 12. The laser light emitted from the semiconductor laser 12 is reflected from the polygonal mirror 13 to the photosensitive drum 11 to form the latent image thereon.

As shown in FIG. 5, the output characteristics of the semiconductor laser 12 such as, the threshold current, an output power of the laser light, etc., are changed in accordance with the change of environmental temperature. Therefore, the following correction for the biasing current to be supplied to the semiconductor laser is required every time a main scanning operation is completed.

First, after a main scanning operation is completed, the laser light is detected by the photosensor 15, and a correction indicating signal CIs is generated at a time (a) as shown in FIG. 6(A). In response to the correction indicating signal CIs, the initializing signal Is is generated in the control circuit 22 as shown in FIG. 6(B), and the predetermined value d is subtracted from an output value of the integrating circuit 24 as shown in FIG. 6(E). At the same time, the control circuit 22 outputs a predetermined voltage as the control signal Cs as shown in FIG. 6(C), and the change-over switch 21 change an output signal from the modulation signal D to the reference signal C, so that the reference signal C is outputted to one input terminal of the adding circuit 23. Further, at the same time, the positive voltage outputted from the comparator 27 is supplied through the AND gate 28 to the integrating circuit 24.

The reference signal C of the reference signal generator 20 and the biasing signal B of the integrating circuit 24 are added to each other in the adding circuit 23, and the driving circuit 25 drives the semiconductor laser 12 on the basis of an output signal of the adding circuit 23. However, in a condition where the integrating circuit 24 is initialized as described above, since the integrated value is set to the initial value for a period (from the time a to the time b in FIG. 6(B)) when input of the initializing signal to the integrating circuit 24 is continued and the initial value is lower than the biasing current immediately before initializing the integrating circuit 22 by the predetermined value (current) d, the detection voltage is lower than the reference voltage and thus the comparator 27 outputs the predetermined positive voltage. After the period is lapsed (at the point b in FIG. 6(B)), the integrating circuit 24 is supplied through the AND gate 28 with the positive voltage outputted from the comparator 27, and integrally increases the input positive voltage. Therefore, the biasing value B to be outputted from the integrating circuit 24 is incremented after the initializing operation of the integrating circuit 24 is completed, and thus the sum of the constant current A of the constant-current circuit 30 and a pumping current which corresponds to a sum of the biasing value B and the reference signal C is increased with time. As a result, the biasing current to be applied to the semiconductor laser 12 and thus the output power of the laser light to be outputted from the semiconductor laser 12 are increased as shown in FIG. 6(E). In accordance with the increase of the light power, the detection voltage to be inputted to the comparator 27 is also increased.

When the detection voltage exceeds the reference voltage (at a time d as shown in FIG. 6(C)), the output voltage of the comparator 27 is changed to 0 volts as shown in FIG. 6(D) and the control circuit 22 detects the change of the output voltage of the comparator 27 to thereby change the control signal Cs to 0 volt. This change of the control signal Cs causes the change-over switch 21 to be switched to supply the modulation signal to the adding circuit, and causes the AND gate 28 to interrupt the supply of the output voltage of the comparator 27 to the integrating circuit 24, so that the biasing value outputted from the integrating circuit 24 is kept to a constant value until a next correction indicating signal CIs is generated.

The above correcting operation of the biasing value is completed after the laser light is supplied to the photosensor 15 and before the laser light is irradiated to the photosensitive drum 11 by rotation of the polygonal mirror 13 for a next main scanning operation. After the correcting operation, the next main scanning operation is commenced with a newly set biasing value.

Figure 1:
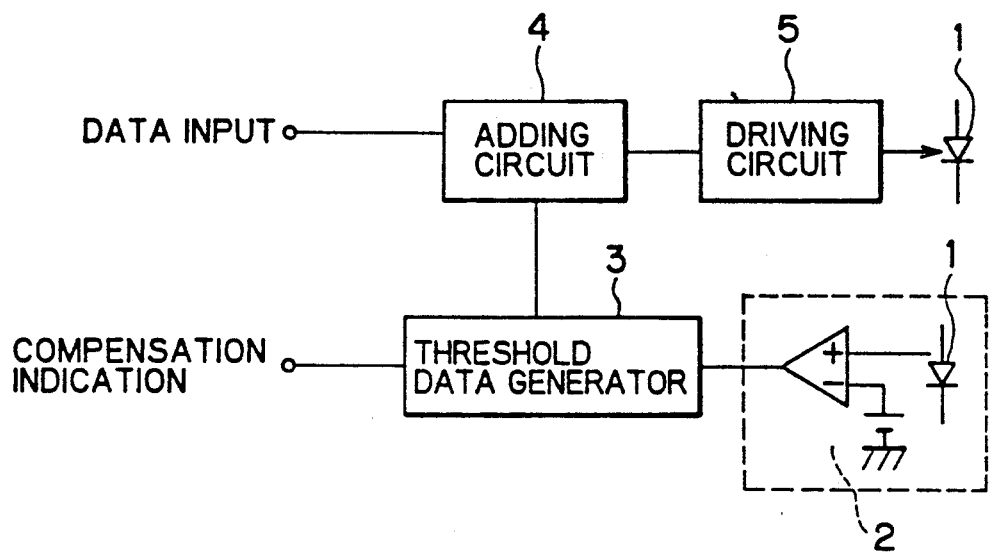
FIG. 1 shows a conventional driving device for a semiconductor laser.
Figure 7:
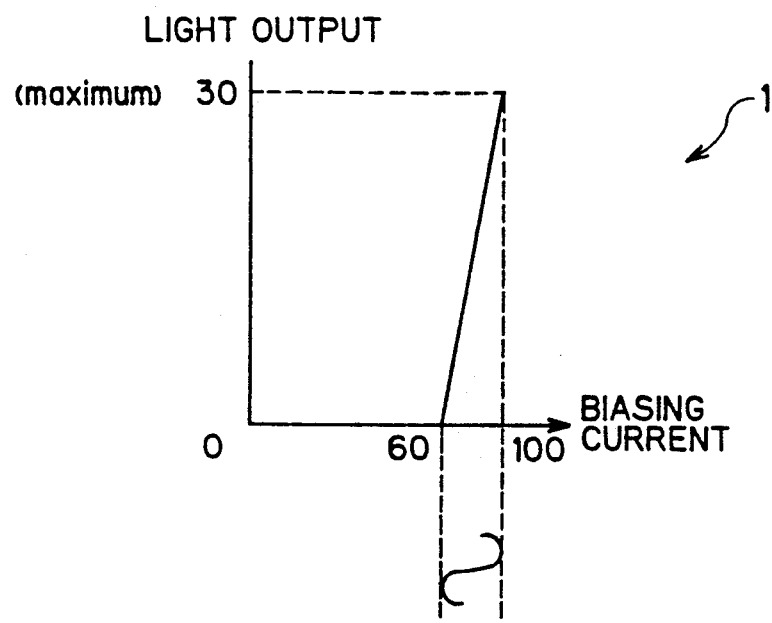
FIG. 7 shows a relationship between an output power of laser light and a biasing current when using a semiconductor laser having the maximum pumping current and the threshold current are 100 mA and 60 mA, respectively.

For example, in a case of using a semiconductor laser having an output characteristic as shown in FIG. 7, data modulation capability of 40 mA (100 mA−60 mA) is required to the driving device, where 100 mA and 60 mA are the maximum pumping current and the threshold current, respectively. Accordingly, an efficiency $\eta$ for analog conversion/digital conversion for the driving device of the above embodiment should be set to the following value.

$$\eta = (100 \text{ mA} - 60 \text{ mA})/255 = 0.16 \text{ mA/1H}$$

In the adding circuit 23, a binary code representing the biasing value of the integrating circuit 24 is added to a binary code representing a modulation signal in one-to-one correspondence (ratio). Of course, another bit ratio may be adopted, however, there is a possibility in this case that unused bits of the codes for the adding operation may occur because the codes are represented in binary notation. Accordingly, a biasing current obtained on the basis of each of biasing values which are represented by 8-bit codes is in the range of 0 to 40 mA. Since the semiconductor laser used in this embodiment has a threshold current of 60 mA, the conventional driving device having the maximum biasing current of 40 mA can not be used for such a semiconductor laser. In addition, the codes of the modulation signals below 20 mA can not be used for the modulating operation, and thus the step number for modulation is remarkably decreased. However, if the constant-current circuit 30 as shown in FIG. 3 is adopted and for example, 40 mA constant current is constantly supplied through the constant-current circuit 30 irrespective of variation in load, the operating area of the semiconductor laser is apparently decreased by 40 mA, and thus the threshold current is likewise decreased by 40 mA. As described above, the driving device of this embodiment can supply a biasing current from 0 to 40 mA, and thus supply a total biasing current from 40 to 80 mA by adding the biasing current to the constant current of the constant-current circuit 30. Accordingly, the threshold current of 60 mA can be obtained by the driving device according to this embodiment (in this case, 20 mA current is supplied from the driving circuit 25 by the biasing value), and a modulation range of 60 mA to 100 mA can be treated by the this embodiment. Further, even if the operating area is change upwardly (incrementally) or downwardly (decrementally) with biasing current by 20 mA in accordance with the change of temperature, this change can be compensated by changing the biasing value in the manner as described above.

As described above, since the constant-current circuit is used to flow a constant current suitable for individual output characteristics of various semiconductor laser, various types of semiconductors, for example, even a semiconductor laser having a high threshold current can be utilized in this embodiment.

It has been required for the conventional driving device to generate a binary code representing a biasing current (obtained by adding the currents A and B as shown in FIG. 6(E)) through a threshold value generator. Therefore, many bits for a quantizing operation of a biasing value are required to represent the biasing value in a binary code. However, in this embodiment, the current A as shown in FIG. 6(E) is obtained by the constant-current circuit 30, and thus a coding of the current A is not necessary. As a result, a binary code representing the threshold value can be generated by a small number of bits.

As described above, a constant current which is generated by a constant-current generator is beforehand set to a current lower than the lowest limit (threshed current) of the operating area of the semiconductor laser at the lowest permissible temperature, and thus an up-and-down counter for generating a count value having no code, which is obtainable in low price, may be used as a threshold value generator. When a constant-current generator having a constant current other than the current range as described above, a counter for generating a count having a code or other like units is required.

According to this invention, an optimum biasing current for producing a suitable laser power on the basis of a modulation data can be easily obtained. Further, change of a biasing value in accordance with variation of an external factor such as temperature can be easily represented by a small amount of information, for example, a small number of bits. Therefore, a large amount of information may be assigned to representation of modulation data. As a result, the modulation of an image data can be accurately carried out without quantization error.

What is claimed is:

1. A driving device for stimulating light emission of a laser source having a threshold current for the light emission with a pumping signal including a biasing current and an input modulated signal, comprising:
    a driving unit for applying the laser source to the pumping signal to emit laser light from the laser source;
    a photodetecting unit for detecting the laser light and outputting a detection signal representing light amount of the detected laser light;
    a compensating unit for generating a binary-coded biasing signal for producing the biasing current while compensating fluctuation of the threshold current of the laser source on the basis of the detected signal from said photodetecting unit every predetermined period;
    an adding unit for adding the biasing signal of said compensating unit to the input modulated signal and outputting the added signals therefrom; and
    a constant-current generating unit for generating a predetermined constant current, wherein the constant current of said constant-current generating unit and the added signals of said adding unit are added to each other and supplied to the laser source as the biasing signal.

2. A driving device as claimed in claim 1, wherein said compensating unit comprises a comparing unit for comparing the detection signal with a predetermined reference level to output a comparison signal having a predetermined level when the detection signal is lower than the reference level, and an integrating unit for integrating the comparison signal for a period when the detection signal is lower than the reference level to output an integrated result as a binary-coded biasing signal.

3. A driving device as claimed in claim 2, wherein said compensating unit further comprises an AND gate for passing the comparision signal from said comparing unit therethrough to said integrating unit for a period when the detection signal is lower than the reference level.

4. A driving device as claimed in claim 2, wherein said integrating unit comprises a clock generator and an up-and-down counter.

5. A driving device as claimed in claim 1, wherein the predetermined constant current is a current lower than a threshold current of the semiconductor laser at a minimum permissible temperature.

6. A driving device as claimed in claim 1, wherein the laser source comprises a semiconductor laser.

* * * * *